United States Patent
Chang et al.

(10) Patent No.: US 7,642,770 B2
(45) Date of Patent: Jan. 5, 2010

(54) LIGHT-DRIVING SYSTEM CAPABLE OF PROVIDING SIGNAL-MEASURED CALIBRATION AND A METHOD FOR PERFORMING THE SAME

(75) Inventors: An-nan Chang, Chiayi (TW); Chien-ming Chen, Hsin-Chu (TW)

(73) Assignee: MEDIATEK Inc., Hsin-Chu (TW)

( * ) Notice: Subject to any disclaimer, the term of this patent is extended or adjusted under 35 U.S.C. 154(b) by 21 days.

(21) Appl. No.: 11/687,089

(22) Filed: Mar. 16, 2007

(65) Prior Publication Data

US 2008/0224715 A1 Sep. 18, 2008

(51) Int. Cl.
G01R 31/28 (2006.01)
(52) U.S. Cl. ...................... 324/158.1; 324/603; 324/754
(58) Field of Classification Search ................. 324/601, 324/603, 751–752, 74, 130; 702/107
See application file for complete search history.

(56) References Cited

U.S. PATENT DOCUMENTS

| | | | | |
|---|---|---|---|---|
| 5,024,535 A | * | 6/1991 | Winston, Jr. ................ 374/178 |
| 5,276,671 A | * | 1/1994 | Minami et al. ............... 369/116 |
| 5,414,280 A | * | 5/1995 | Girmay ........................ 257/80 |
| 5,473,153 A | * | 12/1995 | Araki et al. .................. 250/205 |
| 6,784,674 B2 | | 8/2004 | Miller | |
| 6,927,078 B2 | * | 8/2005 | Saijyo et al. ................... 438/10 |
| 7,002,131 B1 | * | 2/2006 | Lewis ...................... 250/214 A |
| 7,045,752 B2 | * | 5/2006 | Posamentier et al. ......... 250/205 |
| 2002/0186029 A1 | * | 12/2002 | Dangelmayer et al. ...... 324/754 |
| 2007/0114361 A1 | * | 5/2007 | Kunst et al. ................. 250/205 |

* cited by examiner

*Primary Examiner*—Ha Tran T Nguyen
*Assistant Examiner*—Arleen M Vazquez (57) ABSTRACT

This present invention discloses a light-driving system capable of providing an accurate calibration of signal measurement and a method for performing the same, including an automatic power control (APC) circuit which is pre-calibrated for a signal measurement process. By enlarging at least one measured pad of the APC circuit, multiple grounding paths are established via a plurality of probes of a test instrument. An impedance effect predicted on the contact between the probes and the pad is diminished greatly. A voltage value on the pad can be accurately measured. Thus, a reference voltage value input to a first input of a comparator of the APC circuit can be determined on a basis of a specific condition when a ramping voltage value input to a second input of the comparator is substantially equal to a sum of a predetermined reference voltage value and the voltage value of the pad.

17 Claims, 8 Drawing Sheets

LIGHT-DRIVING SYSTEM CAPABLE OF PROVIDING SIGNAL-MEASURED CALIBRATION AND A METHOD FOR PERFORMING THE SAME

FIELD OF THE INVENTION

The present invention relates to a system and method for performing the same, and more particularly in a light-driving system capable of providing an accurate calibration of signal measurement thereon.

BACKGROUND OF THE INVENTION

As known, an impedance effect frequently causes an inaccurate signal measurement for a circuitry system. The impedance effect may be resulted from various factors, including, for instances, an improper measuring operation on testing tool, a hetero-metal junction between the testing tool and a device under test, a circumstance interference, an environmental variation, and so on. Presently, it is regarded as one of the important performance indicators for a circuitry system to provide a capability of accurate calibration of a signal measurement with violation of an impedance effect.

Figure 1A:
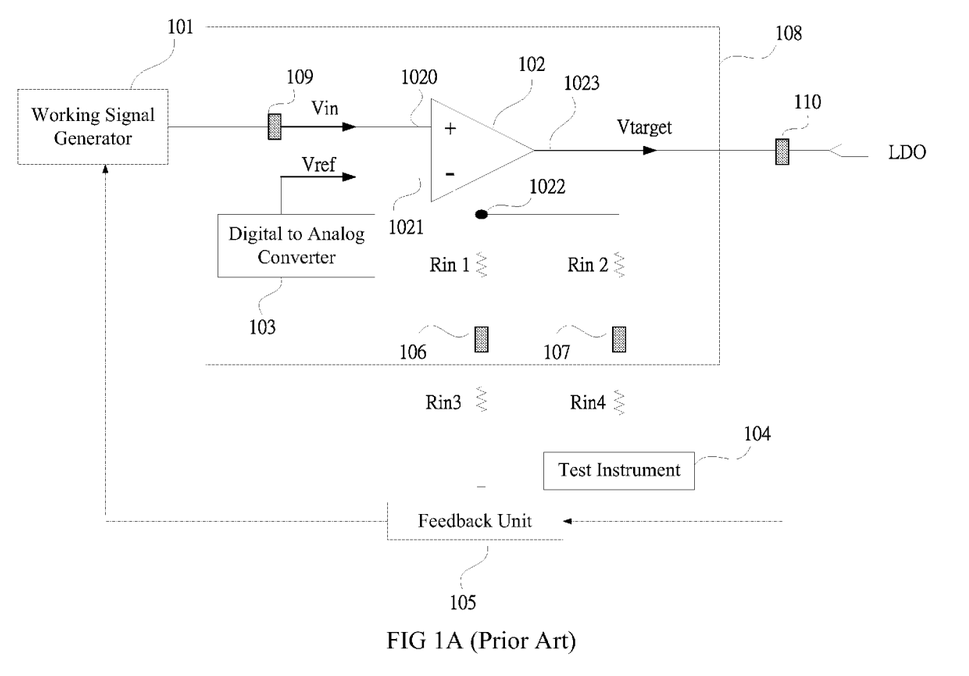
FIG. 1A is a schematic diagram illustrating a conventional light-driving system with usage of APC circuit that is pre-measured by a test instrument.

FIG. 1A illustrates a conventional light-driving circuitry system including an automatic power control (APC) circuit 108, a working signal generator 101, a feedback unit 105 and a plurality of measured pads 106, 107, 109, 110 formed on the system 1. The working signal generator 101 contains a light-radiating device (i.e. a Laser Diode, LD) and a power detector (e.g. a Photodiode, PD) for monitoring a power output of a light emitted from the light-radiating device and then gradually output a working voltage "$V_{in}$" based on said power output. The automatic power control (APC) circuit 108 further contains a comparative unit 102 and a digital to analog converter 103 wherein the digital to analog converter 103 is used for setting a reference voltage "$V_{ref}$" on demands. The comparative unit 102 as a comparator has two inputs 1020, 1021 for receiving the working voltage "$V_{in}$" and the reference voltage "$V_{ref}$", an output 1023 for outputting a target voltage "$V_{target}$" to a Laser Diode Output ("LDO") depending upon a comparison result between the working voltage "$V_{in}$" and the reference voltage "$V_{ref}$", and a node 1022 individually connected to the two measured pads 106 and 107 for the signal measurement. Due to a circuit layout of connection of the couple of measured pads 106, 107 to the node 1022 of the comparative unit 102, a couple of trace resistances as two resistors "Rin1" and "Rin2" will be inherently produced therebetween.

The feedback unit 105 receives the target voltage "$V_{target}$" from the comparative unit 102, and then generates a current control signal to adjust the logic level of the working voltage output of the working signal generator 101, based on level variation of the target voltage "$V_{target}$". If the working voltage reaches a specific condition, for example, having the same value/level as the reference voltage "$V_{ref}$", the target voltage "$V_{target}$" output of the comparative unit 102 might be inverted into a first logic-level (e.g. a logic low) to keep the level of the working voltage output of the working signal generator 101 unchanged for a next operating cycle; Otherwise, the target voltage "$V_{target}$" of the comparative unit 102 might be at a second logic-level (e.g. a logic high) to order/switch the feedback unit 105 to gradually modify the level of the working voltage output of the working signal generator 101 for a next operating cycle.

Before the automatic power control (APC) circuit 108 is electrically connected with the working signal generator 101 and the feedback unit 105, a calibration of a signal measurement for diminishing the impedance effect predicted on the automatic power control (APC) circuit 108 is required. A test instrument 104 such as a parameter measuring unit (PMU) or a voltmeter provides a plurality of probes connected thereon, including two probes (not shown) which are respectively utilized to contact the pads 106 and 107 for indicating a voltage of the pad 107 for signal calibration. If there is a non-ideal contact established between the probes and the respective measured pads 106, 107, a couple of contacting resistances such as two resistors "Rin3" and "Rin4" will be inherently produced therebetween. A high-impedance input will be generated in the test instrument 104. Beside, one of the probes connected with the measured pad 106 is grounded. Nevertheless, on the circuitry system, an using area occupied by each of the measured pads 106, 107 is limited in approximate 50 μm 50 μm, and a pitch between the probes remains at approximate 40 μm.

Figure 1B:
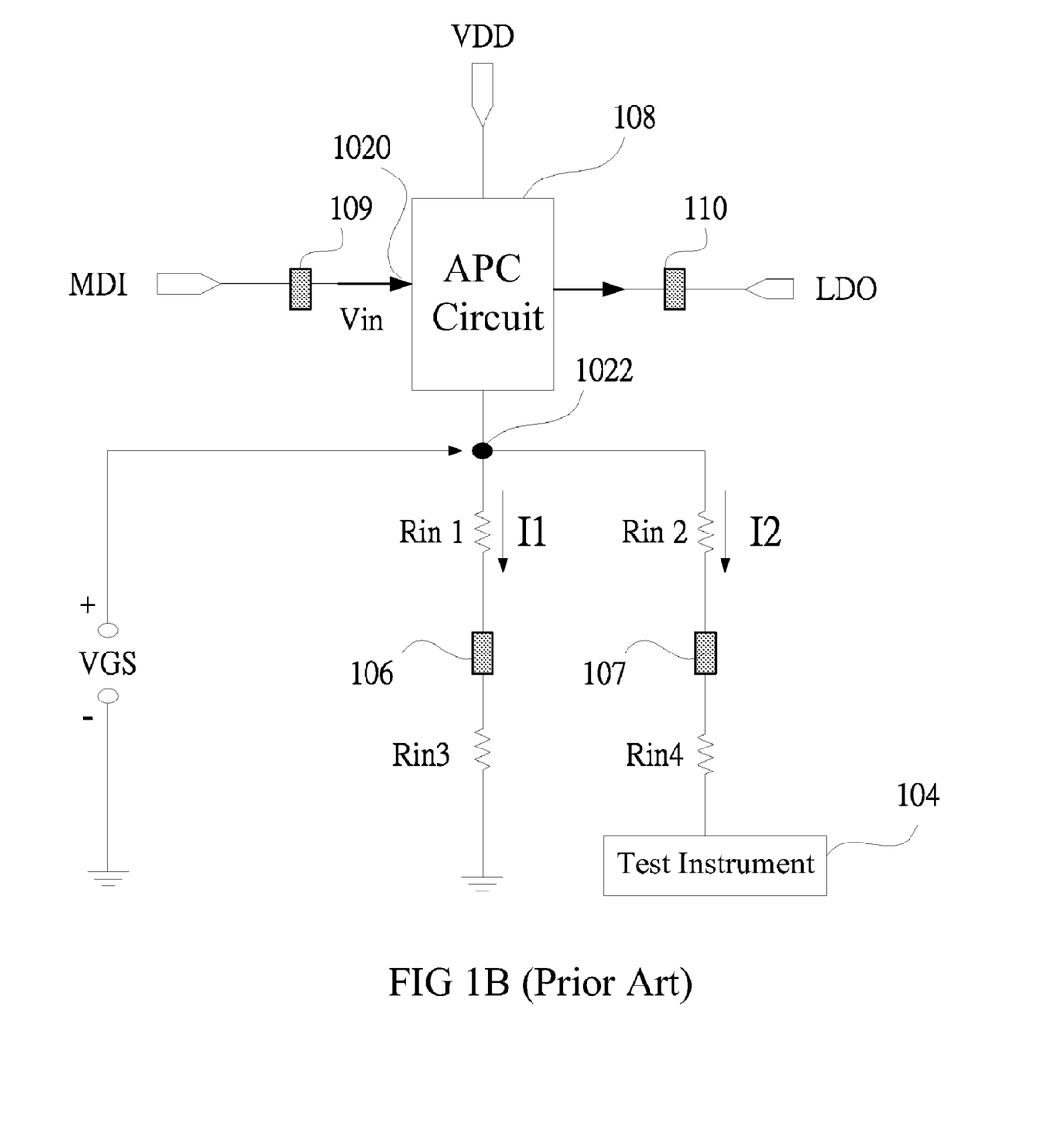
FIG. 1B is a schematic diagram illustrating the conventional APC circuit in form of integrated circuit (IC) chip that is being measured by the test instrument.

Further referring to FIG. 1B, the automatic power control (APC) circuit 108 is being in form of an integrated circuit (IC) chip. The APC circuit chip 108 contains the comparative unit 102, the digital to analog converter 103 (as shown in FIG. 1A), and a plurality of pins extended from the APC circuit chip 108 including, for example, a power pin "VDD", a Monitor Diode Input ("MDI") pin, a Laser Diode Output ("LDO") pin, and a ground pin 1022 (as the node 1022 of the comparative unit 102 shown in FIG. 1A).

Similarly, the ground node 1022 of the APC circuit chip 108 is individually connected to the couple of measured pads 106, 107 thereby producing a couple of trace resistances as the two resistors "Rin1" and "Rin2". In such a circuitry layout, the location of pad 106 is more far from the APC circuit chip 108 for a grounding usage after the APC circuit 108 is packaged, rather than the pad 107 that is more adjacent to a trimming circuit. This would cause the difference trace resistances (i.e. Rin2<Rin1) for both pads 106, 107. Beside, due to a non-ideal contact between the probes and the pads 106, 107, the couple of contacting resistances as the two resistors "Rin3" and "Rin4" are produced as well as forming a high-impedance input during the signal measurement of the test instrument 104. The two resistors "Rin3" and "Rin4" derived from contacts of the probes will greatly contribute a voltage potential "$V_{GS}$" on the ground node 1022 of the APC circuit chip 108. When the APC circuit chip 108 is turned on, the voltage potential "$V_{GS}$" on the ground node 1022 will increase a potential offset of the working voltage "$V_{in}$" input of the APC circuit chip 108. The result of the signal measurement for the working voltage "$V_{in}$" input of the APC circuit chip 108 would be inaccurate. Thus, it is essential that the potential offset of the working voltage "$V_{in}$" input of APC circuit chip 10 must be properly pre-trimmed with reference to this voltage potential on the pad.

For measuring the voltage potential "$V_{GS}$" on the ground node 1022, the test instrument 104 (like a PMU) only needs to directly measures a voltage potential "$V_{P107}$" on the pad 107 to serve as a voltage value "$V_{GS}$" of the ground node 1022, thereby indicates a measured voltage "$V_{PMU}$" thereon (i.e. $V_{PMU}=V_{P107}=V_{GS}$), with utilization of a minimum current "I2" (approaching zero) flowing through the resistors "Rin2" and "Rin4", regardless of resistance values on the resistors "Rin2" and "Rin4". After such an APC circuit chip 108 is packaged, only the pad 106 is grounded and the resistance value of the resistor "Rin3" might become zero. A voltage difference of approximate 14 mv from the pad 106 to the ground node 1022 would be caused. For this case, if it is desirable that a required potential level of the working voltage "$V_{in}$" input of the APC circuit chip 108 is kept at 185mv after the APC circuit chip 108 is packaged, a ramping voltage "$V_{in}$" output to the APC circuit chip 108 before packaged needs to be pre-adjusted to reach "185 mv+($V_{P107}$−14 mv)" by a trimming circuit.

In another case, as soon as a poor contact occurring between the probe and pad 106, a resistance of the resistor "Rin3" would become enlarged to raise the voltage "$V_{GS}$" of the ground node 1022 to reach a range of 70 mv~80 mv. Correspondingly, the ramping voltage "$V_{in}$" output of the APC circuit chip 108 should be adjusted into a voltage range of 241 mv~251 mv. As this result, the ramping voltage "$V_{in}$" which has been adjusted within the range of 241 mv~251 mv, greatly exceeds a predetermined target voltage value in level. Therefore, if the voltage "$V_{GS}$" of the ground node 1022 becomes raised greatly in approaching 40 mv, a calibration of the reference voltage "$V_{ref}$" input (as shown in FIG. 11A) of the APC circuit chip 108 would be required. Oppositely, if the voltage "$V_{GS}$" of the ground node 1022 becomes raised greatly in exceeding 40 mv, it is necessary that the grounding pin (as the ground node 1022) of the APC circuit chip 108 would be fixed.

Due to usage of only one grounding path, the conventional APC circuit chip would need pin fixing as long as a poor contact between the probe and the ground pin 1022 frequently occurs. This results in a lower chip yield and a higher manufacturing expense during a process of mass manufacture.

Another conventional method for measuring wafer yield disclosed in U.S. Pat. No. 6,784,674 introduces a probe board having signal paths between an integrated circuit (IC) tester and probes accessing terminals on the surfaces of ICs formed on a semiconductor wafer for receiving test signals form the IC tester. Hence, a failure occurs under circumstances, such as an improper contact with the measure pad, will cause a connecting resistance with the probe.

Therefore, it is essential to design a method and a mechanism for accurately calibrating signal measurement of a circuitry system, capable of reducing the impedance effect which may be resulted from electrical contact of a probing head of a test instrument with a testing pad located in the circuitry system during this signal measurement process.

SUMMARY OF THE INVENTION

It is a primary objective of the present invention to provide a light-driving system having an automatic power control (APC) circuit capable of providing an accurate calibration of signal measurement and method for performing the same for increasing a fabricating yield of the system.

It is a secondary objective of the present invention to provide a light-driving system using which has an automatic power control (APC) circuit disposed with an enlarged-area measured pad than other pad of the prior art for establishing multiple grounding paths to a test instrument thereby raising an accuracy of the signal measurement.

It is thirdly objective of the present invention to provide to provide a light-driving system which has an automatic power control (APC) circuit disposed with an enlarged-area measured pad than other pad of the prior art for diminishing a probing resistance resulted from a poor contact between the probe of the test instrument and the measured pad.

To achieve the aforementioned objectives, according to a first preferred embodiment of the present invention, a light-driving system is introduced as including a light emission device for emitting a light in response to a control signal, a power detection device for detecting a power of the light to generate a working voltage signal, an automatic power control (APC) circuit for adaptively controlling the power output of the light, and a feedback circuit.

In a fabricating process, the automatic power control (APC) circuit is made on a semiconductor wafer. Before the APC circuit is packaged and electrically connected with other electric components to constructing the whole light-driving circuitry system, a calibration of a signal measurement of the APC circuit is preformed for diminishing involvement of a measuring deviation (e.g. an improper-probing or a trace resistance) predicted thereon. In a signal measurement process, a working signal generator is employed to gradually generate varied ramping voltage with different levels to serves as a working voltage input for the APC circuit.

The automatic power control (APC) circuit further includes a digital to analog converter for converting into a reference voltage output, and a comparator which has a first and second inputs for respectively receiving the ramping voltage and the reference voltage, a signal output for outputting a deciding voltage signal depending upon a comparison result between the ramping voltage and the reference voltage, and a grounding node for electrically connecting a enlarged measured pad formed on the APC circuit. A test instrument has a plurality of probes including at least a first probe, a second probe and a third probe used for contacting the enlarged measured pad for performing the signal measurement.

Furthermore, the present invention introduces a calibrating method for determining a voltage value output to the first input of said comparator of the APC circuit during the signal measurement, comprising:

probing the enlarged measured pad with the first probe of the test instrument to ground the enlarged measured pad via a first probing resistance produced between the first probe and the enlarged measured pad;

probing the enlarged measured pad with the second probe of the test instrument to ground the enlarged measured pad via a second probing resistance produced between the second probe and the enlarged measured pad, and to measure a voltage value from the enlarged measured pad;

probing the enlarged measured pad with the third probe of the test instrument to ground the enlarged measured pad via a third probing resistance produced between the third probe and the enlarged measured pad;

by the working signal generator, providing the ramping voltage to the second input of the comparator; and tuning the digital to analog converter to determine the voltage value output from the digital to analog converter to the first input of the comparator on a basis of a specific condition when a value of the ramping voltage is substantially equal to a sum of a predetermined reference voltage value and the voltage value of the enlarged measured pad so that an output voltage of the comparator is inverted on different level.

According to a second preferred embodiment of the present invention, a light-driving system is introduced as including a light emission device for emitting a light in response to a control signal, a power detection device for detecting a power of the light to generate a working voltage signal, an automatic power control (APC) circuit for adaptively controlling the power output of the light, and a feedback circuit.

Similarly to the first embodiment, before the APC circuit is packaged and electrically connected with other electric components to constructing the whole light-driving circuitry system, a calibration of a signal measurement of the APC circuit is preformed. In a signal measurement process, a working signal generator is employed to gradually generate varied ramping voltage with different levels to serves as a working voltage input for the APC circuit.

The automatic power control (APC) circuit further includes a digital to analog converter for converting into a reference voltage output, and a comparator which has a first and second inputs for respectively receiving the ramping voltage and the reference voltage, a signal output for outputting a deciding voltage signal depending upon a comparison result between the ramping voltage and the reference voltage, and a grounding node for electrically connecting a ground pad and an enlarged test pad formed on the APC circuit. A test instrument has a plurality of probes including, for example, a first probe, a second probe, a third probe and a fourth probe for performing the signal measurement.

Furthermore, the present invention introduces a calibrating method for determining a voltage value output to the first input of said comparator of the APC circuit during the signal measurement, comprising:

probing the ground pad with the first probe of the test instrument to ground the ground pad via a first probing resistance produced between the first probe and the ground pad;

probing the enlarged test pad with the second probe of the test instrument to ground the enlarged test pad via a second probing resistance produced between the second probe and the enlarged test pad;

probing the enlarged test pad with the third probe of the test instrument to ground the enlarged test pad via a third probing resistance produced between the third probe and the enlarged test pad, and to measure a voltage value from the enlarged test pad;

probing the enlarged test pad with the fourth probe of the test instrument to ground the enlarged test pad via a fourth probing resistance produced between the fourth probe and the enlarged test pad;

by the working signal generator, providing the ramping voltage to the second input of the comparator; and tuning the digital to analog converter to determine the voltage value output from the digital to analog converter to the first input of the comparator on a basis of a specific condition when a value of the ramping voltage is substantially equal to a sum of a predetermined reference voltage value and the voltage value of the enlarged test pad so that an output voltage of the comparator is inverted on different level.

The present invention utilizes the enlarged-area measured pad than other pad of the prior art, to establish multiple grounding paths access to a test instrument thereby reducing the impedance effect upon the poor contact with the test instrument to achieve an accurate calibration of signal measurement for increasing a fabricating yield of the system.

BRIEF DESCRIPTION OF THE DRAWINGS

The present invention will be apparent to those skilled in the art by reading the following description of preferred embodiments thereof, with reference to the attached drawings, in which.

DETAILED DESCRIPTION OF THE PREFERRED EMBODIMENTS

The present invention will now be described more specifically with reference to the following embodiments. It is to be noted that the following description of the preferred embodiments of the present invention are presented herein for purpose of illustration and description only and it is not intended to be exhaustive or to be limited to the precise form disclosed.

Figure 2A:
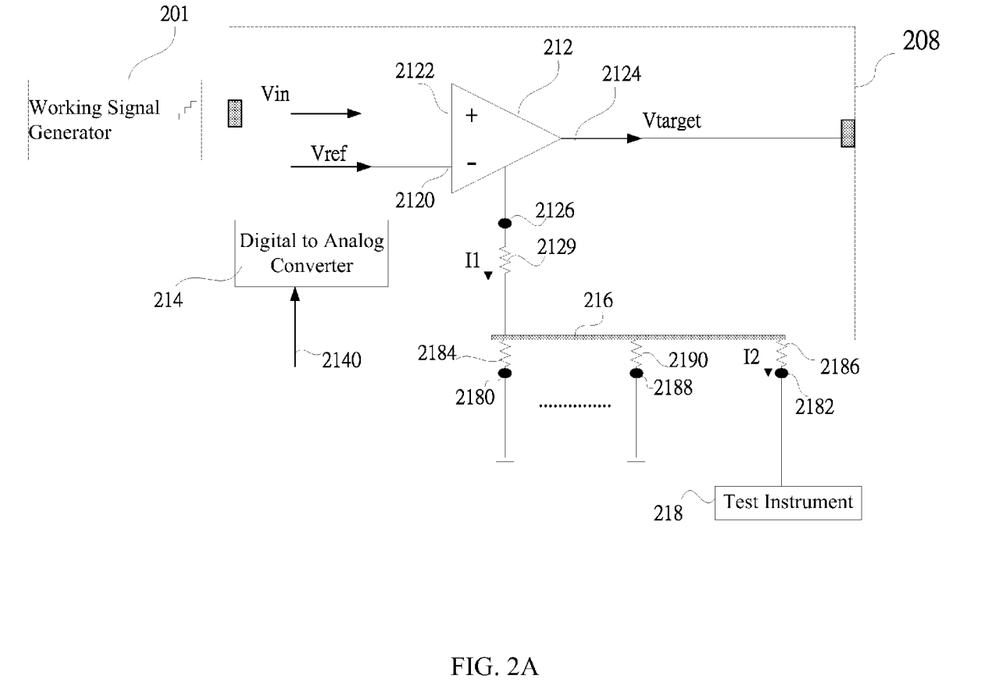
FIG. 2A is a schematic diagram illustrating an APC circuit under test according to a first preferred embodiment of the present invention, having an enlarged-area pad for calibration signal measurement by a test instrument.

Firstly referring to FIG. 2A, an automatic power control (APC) circuit 208 under test is illustrated according to a first preferred embodiment of the present invention. The automatic power control (APC) circuit 208 under test can be made in form of an integrated circuit (IC) formed on a semiconductor wafer (not shown). As aforementioned, before the APC circuit 208 under test is packaged and electrically connected with other electric components (i.e. a feedback circuit) for constructing a complete light-driving circuitry system, a calibration of a signal measurement of the automatic power control (APC) circuit 208 under test is required for diminishing involvement of a measuring deviation (e.g. an improper-probing or a trace resistance) predicted thereon. In a signal measurement process, a working signal generator 201 under test is employed to gradually generate varied ramping voltage "$V_{in}$" with different levels in a raising saw-toothed waveform to serves as a working voltage.

The automatic power control (APC) circuit 208 primarily includes a comparator unit 212 and a digital to analog converter (DAC) 214. The digital to analog converter 214 is used to convert a required digital code input 2140 into an analog-type reference voltage "$V_{ref}$" output. The comparator 212 as an operational amplifier (OP-AMP) has a first and second inputs 2120, 2122 for respectively receiving the ramping voltage "$V_{in}$" and the reference voltage "$V_{ref}$", a signal output 2124 for outputting a deciding voltage signal "$V_{target}$" depending upon a comparison result between the ramping voltage "$V_{in}$" and the reference voltage "$V_{ref}$", and a grounding node 2126 for electrically connecting a measured pad 216 (serving a ground pad) formed on the APC circuit 208. The measured pad 216 is designed for wire bonding of the APC circuit 208 in IC package. Due to a circuitry layout of connecting the measured pad 216 to the grounding node 2126 on the APC circuit 208, a trace resistance as a resistor 2129 will be inherently produced therebetween whereby a current "I1" will be generated to flow through the resistor 2129 during the signal measurement process.

For the signal measurement, a test instrument 218 such as a parameter measuring unit (PMU) or a voltmeter is utilized with a plurality of probes including, for an example, a first probe 2180, a second probe 2182, a third probe 2188 and so on. As long as any one of the probes (like the reference numerals 2180, 2182 and 2188) probes the measured pad 216 by surface contact, a corresponding probing resistance as a resistor (like the reference numerals 2184, 2186 and 2190) may be produced therebetween as forming a high-impedance input for the test instrument 218. Since the first, second and third probes 2180, 2182 and 2188 simultaneously probing the measured pad 216 are grounded in parallel. With establishment of multiple grounding paths from the a measured pad 216 to the test instrument 218 via the plurality of probes 2180, 2182 and 2188, a measuring deviation risk resulted from an improper contact can be greatly diminished than the prior art with usage of a single grounding path. To increase the grounding paths, an occupied area of the measured pad 216 need to be enlarged than other pads of the prior art, thereby accommodating more contacts of the plurality of the probes.

Since the resistance of the resistor 2129 almost approaches zero, a voltage value "$V_{GS}$" of the grounding node 2126 is close to the voltage value "$V_{P216}$" on the enlarged-area measured pad 216. The voltage value "$V_{P216}$" on the enlarged-area measured pad 216 is almost identical with a voltage value "$V_{PMU}$" indicated in the test instrument 218. By the high-impedance input of the test instrument 218, a current I2 flowing through the second probe 2182 will approach zero. And the other probing resistances (such as the two resistors 2184 and 2190) grounded in parallel can be regarded as a substituting or an auxiliary circuit which is capable of reducing an impedance effect caused by a single ground path during the signal measurement. Therefore, the test instrument 218 can directly measure a voltage value "$V_{P216}$" on the enlarged-area measured pad 216 via the second probe 2182 to serve as the voltage value "$V_{GS}$" on the grounding node 2126. The voltage value "$V_{P216}$" on the enlarged-area measured pad 216 is as a measuring deviation contributed by the improper contact of the probes with the enlarged-area measured pads 216.

For example, if it is expected that after packaged, a working voltage input (e.g. a Monitor Diode Input (MDI) pin) of the APC circuit 208 is locked at "185 mv" in compliance with a predetermined reference voltage value, the ramping voltage value "$V_{in}$" generated from the working signal generator 201 to the second input 2122 of the comparator 212 should be gradually pre-calibrated to "185 mv+$V_{P216}$" during the signal measurement process before the APC circuit 208 is packaged. Then the digital to analog converter 214 is successively tuned by adjusting the digital code input 2140 to determine a corresponding reference voltage "$V_{ref}$" value output to the first input 2120 of the comparator 212, based on a specific condition when the ramping voltage value "$V_{in}$" is substantially equal to a sum (e.g. "185 mv+$V_{P216}$") of the predetermined reference voltage value and the voltage value "$V_{P216}$" of the enlarged-area measured pad 216.

After the APC circuit 208 is packaged, according to the determined reference voltage "$V_{ref}$" value output to the first input 2120 of the comparator 212, a working voltage input of the second input 2122 of the comparator 212 will be eventually kept at "185 mv" during a feedback loop.

Figure 4A:
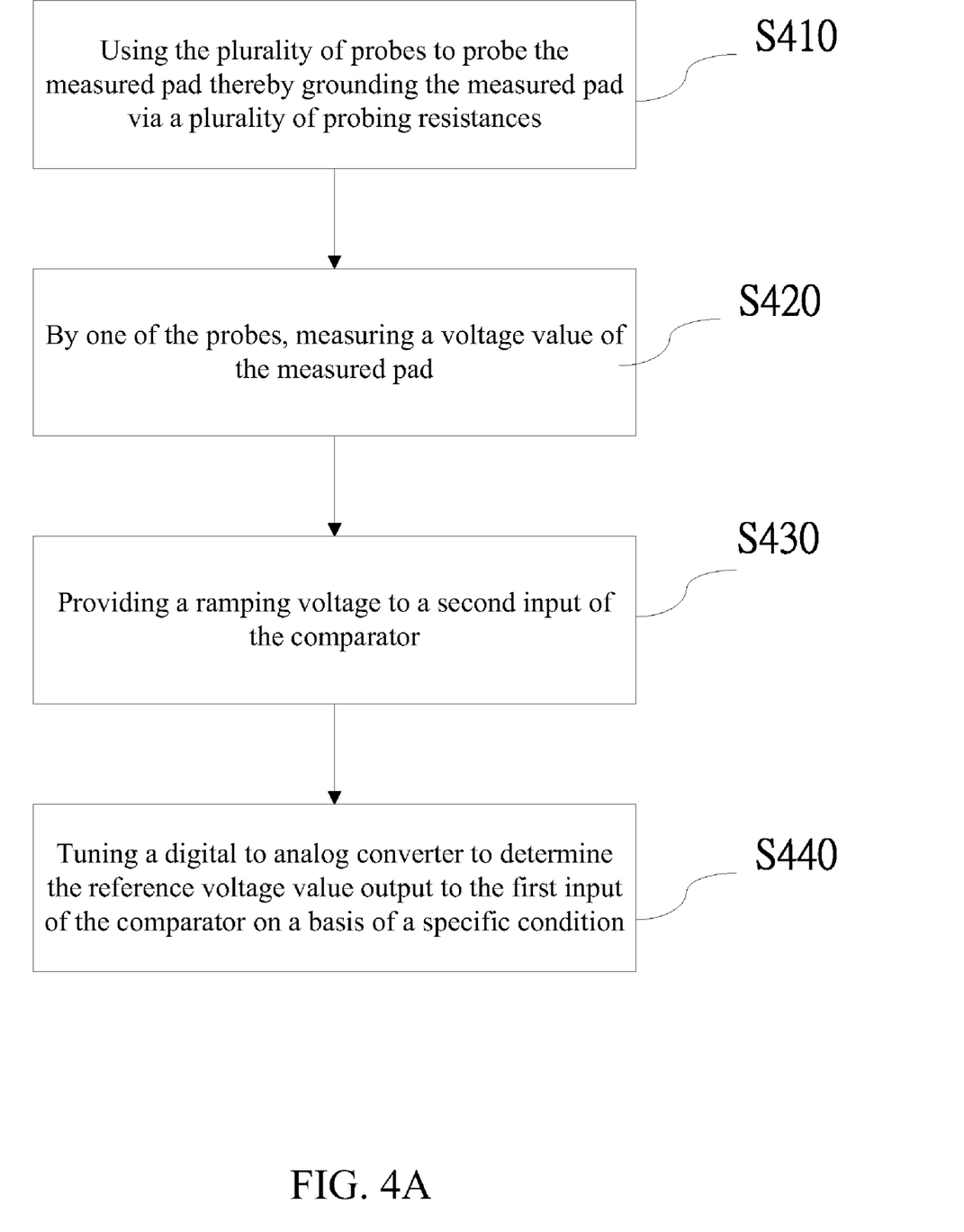
FIG. 4A is a block diagram of a calibrating method for the APC circuit under test according to the first preferred embodiment of the present invention.

Further referring to FIG. 4A according to the first preferred embodiment of the present invention, a calibrating method for determining a reference voltage value output to a first input of the comparator of the APC circuit by a test instrument with a plurality of probes (as shown in FIG. 2A) is presented during a signal measurement process, wherein the comparator has a grounding node electrically connected to a measured pad, and the method comprises the following steps of:

S410, using the plurality of probes to probe the enlarged-area measured pad thereby grounding the enlarged-area measured pad via a plurality of probing resistances which are respectively produced by respective contacts between the plurality of probes and the enlarged-area measured pad. For example, the plurality of probes includes a first probe, a second probe and a third probe;

S420, by one of the probes (i.e. the second probe), measuring a voltage value of the enlarged-area measured pad, which can be indicated in the test instrument (e.g. a Voltmeter);

S430, by a working signal generator, providing a ramping voltage to a second input of the comparator; and S440, tuning a digital to analog converter to determine the reference voltage value output from the digital to analog converter to the first input of the comparator on a basis of a specific condition when the ramping voltage value is substantially equal to a sum of a predetermined reference voltage value and the voltage value of the pad so that an deciding voltage signal output of the comparator is inverted on different level.

Figure 2B:
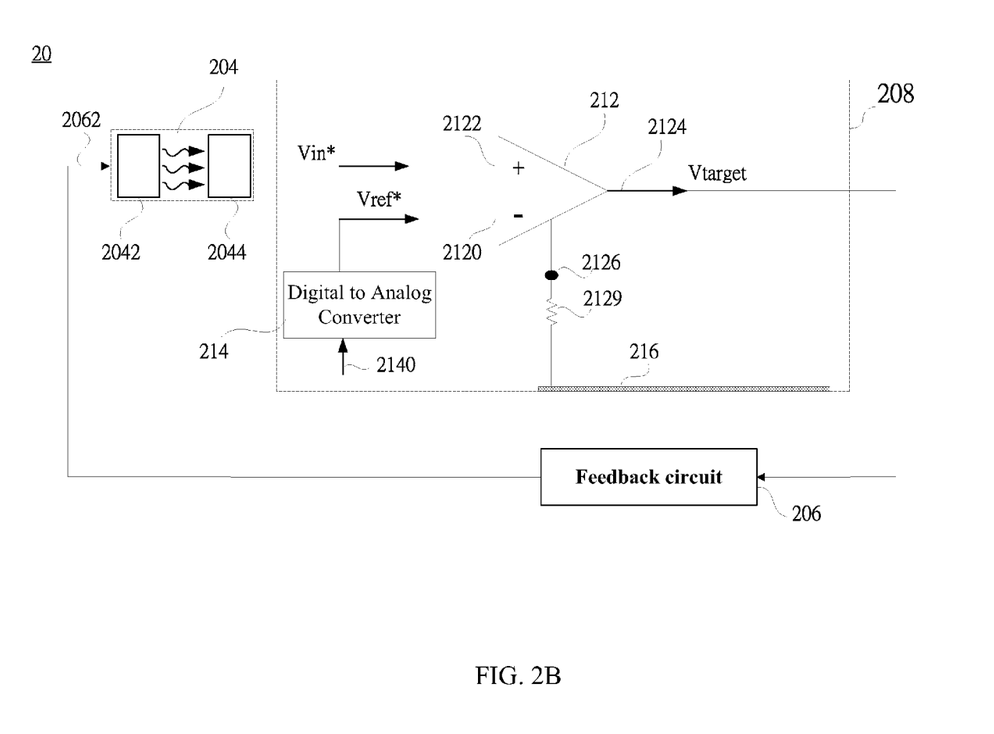
FIG. 2B is a schematic diagram illustrating the calibrated APC circuit shown in FIG. 2A,which is applied in a light-driving circuitry system.

Further referring to FIG. 2B, the automatic power control (APC) circuit 208 that has been calibrated as shown in FIG. 2A is being applied for adaptively controlling a power output of a working signal generator 204 in a light-driving circuitry system 20 according to the first preferred embodiment of the present invention. The automatic power control (APC) circuit 208 shown in FIG. 2B, in form of an integrated circuit (IC), has been separated from the semiconductor wafer (not shown) and has been packaged in electrical connection with the working signal generator 204 and a feedback circuit 206 to construct a loop circuit.

The working signal generator 204 further includes a light emission device 2042 (e.g. a laser pickup) for emitting a light in response to a control signal 2062, and a power detection device 2044 for detecting a power of the light to generate a working voltage signal "$V_{in*}$". The feedback circuit 206 as implementing a bipolar junction transistor (BJT) according to trigger of a specific level of a deciding voltage signal "$V_{target}$" transmits the control signal 2062 to adjust the light power of the light emission device 2042.

The digital to analog converter (DAC) 214 of the automatic power control (APC) circuit 208 is used to convert a required digital code input 2140 into the predetermined reference voltage "$V_{ref*}$" (e.g. 185 mv) output. The first input 2120 of the comparator 212 is electrically connected to the digital to analog converter 214 for receiving the predetermined reference voltage signal "$V_{ref*}$", and the second inputs 2122 of the comparator 212 is electrically connected to the working signal generator 204 for receiving the working voltage signal "$V_{in*}$", the signal output 2124 of the comparator 212 is connected to the feedback circuit 206 for outputting the deciding voltage signal "$V_{target}$", depending upon a comparison result between the working voltage "$V_{in*}$" and the predetermined reference voltage "$V_{ref*}$", and the grounding node 2126 of the comparator 212 is electrically connected to the measured pad 216 formed on the APC circuit 208. If the working voltage value "$V_{in*}$" and predetermined reference voltage value "$V_{ref*}$" of the first and second inputs 2120, 2122 of the comparator 212 are substantially different, the signal output 2124 of the comparator 212 will successively output the deciding voltage signal "$V_{target}$" on a first level to trigger the feedback circuit 206 to vary the power output of the light emission device 2042 until the working and predetermined reference voltage values "$V_{in*}$" and "$V_{ref*}$" are substantially the same so that the deciding voltage signal "$V_{target}$" output from the comparator 212 is inverted from the first level to a second level.

According to the predetermined reference voltage "$V_{ref*}$" output to the first input 2120 of the comparator 212, the working voltage input of the second input 2122 of the comparator 212 will be eventually kept in the same value (e.g. "185 mv") as the predetermined reference voltage "$V_{ref}$" during the feedback loop.

Figure 3A:
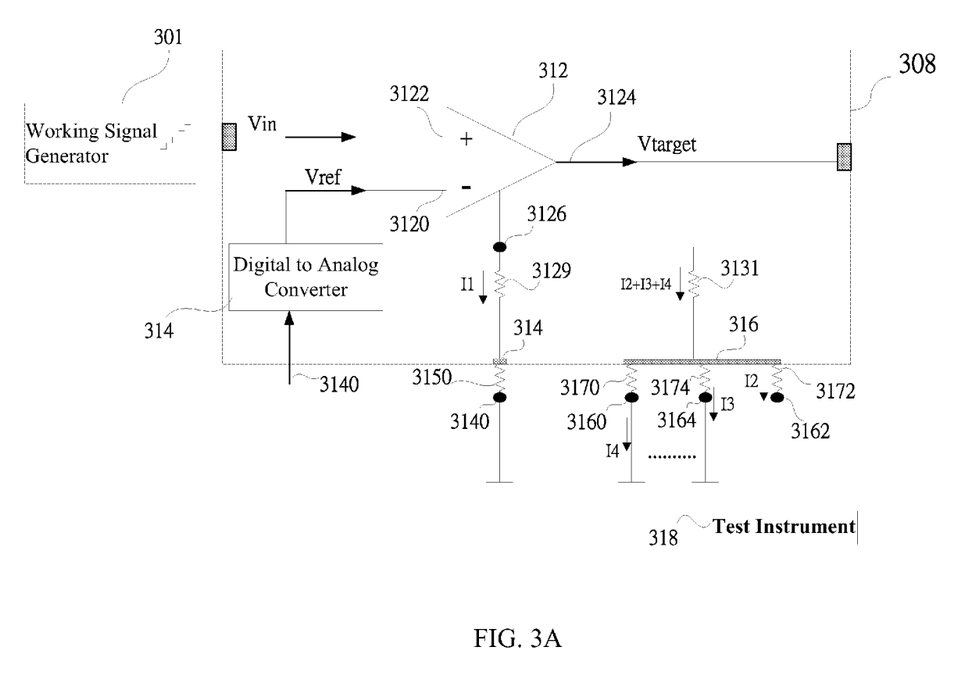
FIG. 3A is a schematic diagram illustrating an APC circuit under test according to a second preferred embodiment of the present invention, having a ground and an enlarged-area test pad for calibration signal measurement by a test instrument.

Alternatively referring to FIG. 3A, an automatic power control (APC) circuit 308 under test according to a second preferred embodiment of the present invention is illustrated. The automatic power control (APC) circuit 308 under test can be made in form of an integrated circuit (IC) formed on a semiconductor wafer (not shown). Before the APC circuit 308 under test is packaged and electrically connected with other electric components (i.e. a feedback circuit) for constructing a complete light-driving circuitry system, a calibration of a signal measurement of the automatic power control (APC) circuit 308 is required. In a signal measurement process, a working signal generator 301 is employed to gradually generate a varied ramping voltage "$V_{in}$" with different levels in a raising saw-toothed waveform to serves as a working voltage.

The automatic power control (APC) circuit 308 includes a comparator unit 312 and a digital to analog converter (DAC) 314. The digital to analog converter 314 is used to convert a required digital code input 3140 into an analog-type reference voltage "$V_{ref}$" output. The comparator 312 as an operational amplifier (OP-AMP) has a first and second inputs 3120, 3122 for respectively receiving the ramping voltage "$V_{in}$" and the reference voltage "$V_{ref}$", a signal output 3124 for outputting a deciding voltage signal "$V_{target}$" depending upon a comparison result between the ramping voltage "$V_{in}$" and the reference voltage "$V_{ref}$", and a grounding node 3126 for individually connecting a first measured pad 314 (serving as a ground pad) and a second measured pad 316 (serving as a test pad) formed on the APC circuit 308. The first measured pad 314 is designed for wire bonding of the APC circuit 308 in IC package, and the second measured pad 316 is designed adjacent to a trimming circuit. Due to the circuitry layouts of connecting the grounding node 3126 to the first and second measured pads 314, 316 on the APC circuit 308, two trace resistances as two resistors 3129, 3131 will be inherently produced therebetween whereby a current "I1" will be generated to flow through the resistor 3129, and a current "I2+I3+I4" will flow through the resistor 3131 during the signal measurement process.

For the signal measurement, a test instrument 318 such as a parameter measuring unit (PMU) or a voltmeter is utilized with a plurality of probes including, for an example, a first probe 3140, a second probe 3160, a third probe 3162, a fourth probe 3164 and so on. As long as any one of the probes (like the reference numerals 3140, 3160, 3162 and 3164) probes the first and second measured pads 314, 316 to establish a poor surface contact, a corresponding probing resistance as a resistor (like the reference numerals 3150, 3170, 3172 and 3174) may be produced, as forming a high-impedance input for the test instrument 318. Since the first probes 3140 probing the first measured pad 314, and the second, third and fourth probes 3160, 3162 and 3164 simultaneously probing the second measured pad 316 all are grounded in parallel. With establishment of multiple grounding paths from the first and second measured pads 314, 316 to the test instrument 318 via the plurality of probes 3140, 3160, 3162 and 3164, the measuring deviation resulted from an improper contact can be greatly diminished than the prior art with usage of a single grounding path. To increase the grounding paths, an occupied area of the second measured pad 316 need to be enlarged than other pads of the prior art, thereby accommodating more contacts of the plurality of the probes. By the high-impedance input of the test instrument 318, a current I2 flowing through the third probe 3162 will approach zero. The resistance of the resistor 3131 almost approaches zero so that a voltage value "$V_{GS}$" on the grounding node 3126 is close to a voltage value "$V_{P316}$" on the second measured pad 316. The voltage value "$V_{P316}$" on the second measured pad 316 is almost identical with a voltage value "$V_{PMU}$" indicated in the test instrument 318. Thus, the other probing resistances (such as the two resistors 3170 and 3174) grounded in parallel can be regarded as a substituting or an auxiliary circuit which is capable of reducing an impedance effect caused by a higher probing resistance of the resistor 3150 during the signal measurement. For this moment, the test instrument 318 can directly measure a voltage value "$V_{P316}$" on the second measured pad 316 via the third probe 3162. The voltage value "$V_{P316}$" on the second measured pad 316 is as a measuring deviation contributed by the improper contact of the probes with the measured pads 314, 316. The voltage value "$V_{P316}$" on the second measured pad 316 may be identical with "$V_{GS} \times (R_{3170}/(R_{3131}+R_{3170}))$" wherein the "$V_{GS}$" represents a voltage value on the grounding node 3126, the "$R_{3170}$" represents the probing resistance value of the resistor 3170, and the "$R_{3131}$" represents the trace resistance value of the resistor 3131. Since the trace resistance value "$R_{3131}$" of the resistor 3131 is very minor, the voltage value "$V_{P316}$" actually measured on the second measured pad 316 is close to the voltage value "$V_{GS}$" of the grounding node 3126.

For example, if it is expected that after packaged, a working voltage input (e.g. a Monitor Diode Input (MDI) pin) of the APC circuit 308 is locked at "185 mv" in compliance with a predetermined reference voltage value, the ramping voltage value "$V_{in}$" generated from the working signal generator 301 to the second input 3122 of the comparator 312 should be gradually pre-calibrated to "185 mv+$V_{P316}$" during the signal measurement process before the APC circuit 308 is packaged. Then the digital to analog converter 314 is successively tuned by adjusting the digital code input 3140 to determine a corresponding reference voltage "$V_{ref}$" value output to the first input 3120 of the comparator 312, based on a specific condition when the ramping voltage value "$V_{in}$" is substantially equal to a sum (e.g. "185 mv+$V_{P316}$") of the predetermined reference voltage value and the voltage value "$V_{P316}$" of the second measured pad 316.

After the APC circuit 308 is packaged, according to the determined reference voltage "$V_{ref}$" value output to the first input 3120 of the comparator 312, a working voltage input of the second input 3122 of the comparator 312 will be eventually kept at "185 mv" during a feedback loop.

Figure 4B:
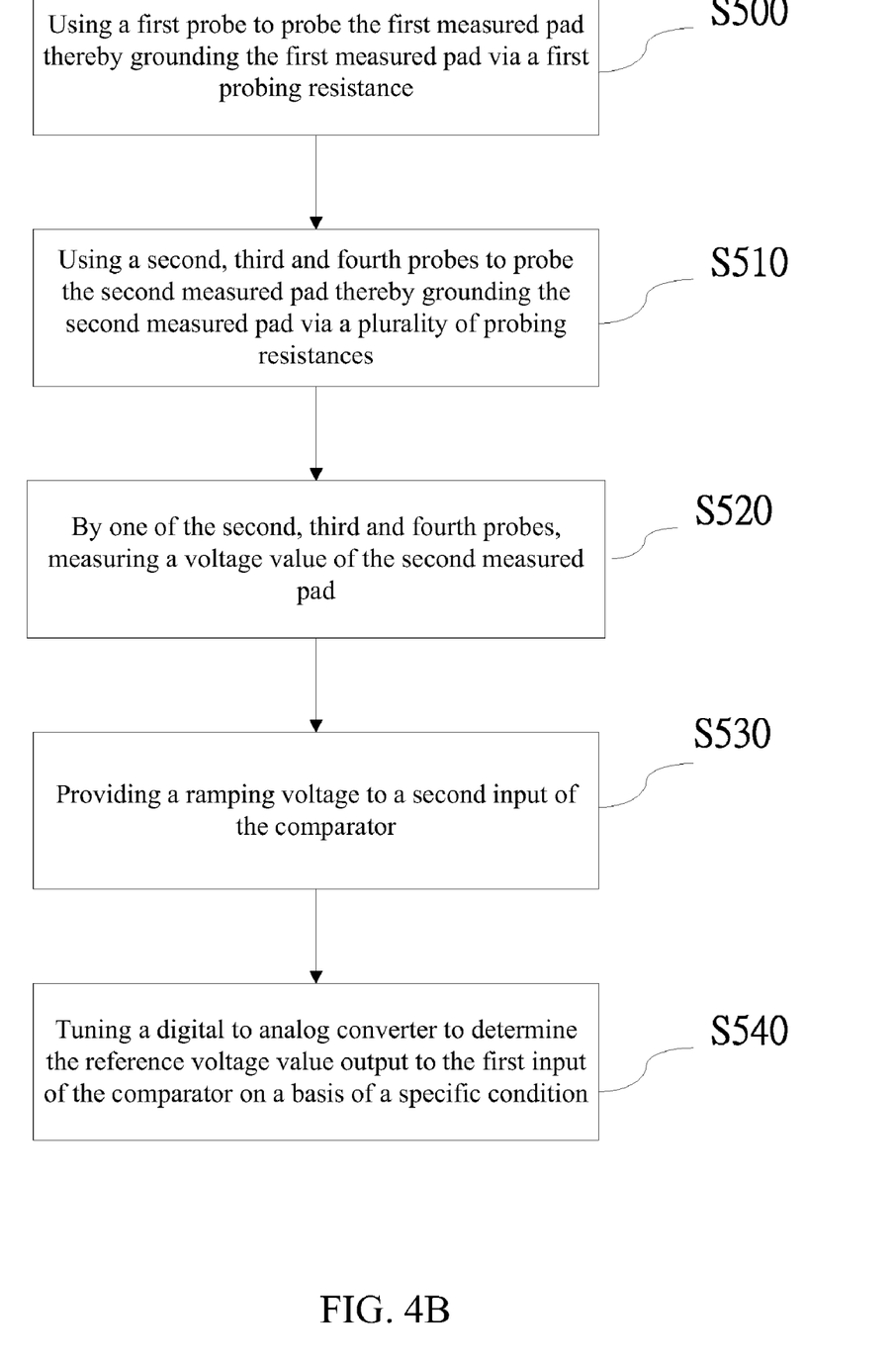
FIG. 4B is a block diagram of a calibrating method for the APC circuit under test according to the second preferred embodiment of the present invention.

Further referring to FIG. 4B according to the first preferred embodiment of the present invention, a calibrating method for determining a reference voltage value output to a first input of the comparator of the APC circuit by a test instrument with a plurality of probes (as shown in FIG. 3A) is presented, during the signal measurement wherein the comparator has a grounding node electrically connected to a first and second measured pads, and the method comprises the following steps of:

S500, using the part of the probes (i.e. a first probe) to probe the first measured pad thereby grounding the first measured pad via a first probing resistance which is produced by improper contact between the first probe and the first measured pad;

S510, using the rest probes (i.e. a second, third and fourth probes) to probe the second measured pad thereby grounding the second measured pad via a plurality of probing resistances corresponding to respective contacts between the rest probes and the second measured pad;

S520, by one of the second, third and fourth probes (i.e. the third probe), measuring a voltage value of the second measured pad, which can be indicated in the test instrument (e.g. a Voltmeter);

S530, by a working signal generator, providing a ramping voltage to a second input of the comparator; and S540, tuning a digital to analog converter to determine the reference voltage value output from the digital to analog converter to the first input of the comparator on a basis of a specific condition when the ramping voltage value is substantially equal to a sum of a predetermined reference voltage value and the voltage value of the second measured pad so that an deciding voltage signal output of the comparator is inverted on different level.

Figure 3B:
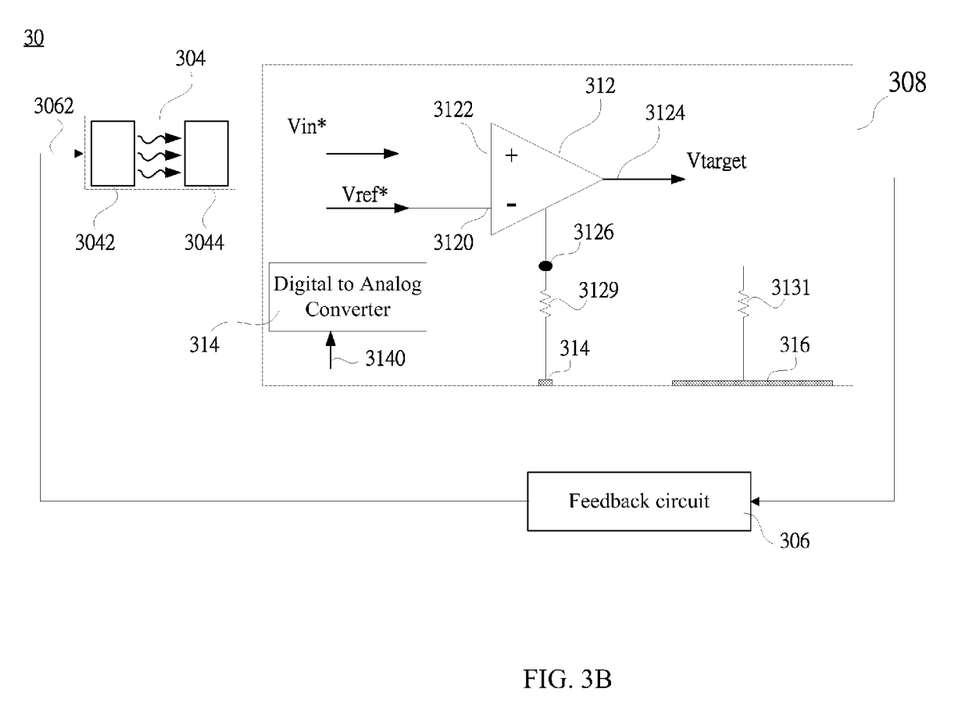
FIG. 3B is a schematic diagram illustrating the calibrated APC circuit shown in FIG. 3A,which is applied in a light-driving circuitry system.

Further referring to FIG. 3B, said automatic power control (APC) circuit 308 that has been calibrated as shown in FIG. 3A is being applied for adaptively controlling a power output of a working signal generator 304 in a light-driving circuitry system 30 according to the second preferred embodiment of the present invention. The automatic power control (APC) circuit 308 shown in FIG. 3B, in form of an integrated circuit (IC), has been separated from the semiconductor wafer (not shown) and has been packaged in electrical connection with the working signal generator 304 and a feedback circuit 306 to construct a loop circuit.

The working signal generator 304 further includes a light emission device 3042 (e.g. a laser pickup) for emitting a light in response to a control signal 3062, and a power detection device 3044 for detecting a power of the light to generate a working voltage signal "$V_{in*}$". The feedback circuit 306 as implementing a bipolar junction transistor (BJT) based on trigger of a specific level of a deciding voltage signal "$V_{target}$", transmits the control signal 3062 to adjust the light power of the light emission device 3042.

The digital to analog converter (DAC) 314 of the automatic power control (APC) circuit 308 is used to convert a required digital code input 3140 into the predetermined reference voltage "$V_{ref*}$" (e.g. 185 mv) output. The first input 3120 of the comparator 312 is electrically connected to the digital to analog converter 314 for receiving the predetermined reference voltage signal "$V_{ref*}$", and the second inputs 3122 of the comparator 312 is electrically connected to the working signal generator 304 for receiving the working voltage signal "$V_{in*}$", the signal output 3124 of the comparator 312 is connected to the feedback circuit 306 for outputting the deciding voltage signal "$V_{target}$" depending upon a comparison result between the working voltage "$V_{in*}$" and the predetermined reference voltage "$V_{ref*}$", and the grounding node 3126 of the comparator 312 is electrically connected to the first and second measured pad 314, 316 formed on the APC circuit 308. If the predetermined reference voltage value "$V_{ref*}$" and the working voltage value "$V_{in*}$" of the first and second inputs 3120, 3122 of the comparator 312 are substantially different, the signal output 3124 of the comparator 312 will successively output the deciding voltage signal "$V_{target}$" on a first level to trigger the feedback circuit 306 to vary the power output of the light emission device 2042 until the working and predetermined reference voltage values "$V_{in*}$", "$V_{ref*}$" are substantially the same so that the deciding signal "$V_{target}$" output from the comparator 312 is inverted from the first level to a second level.

According to the predetermined reference voltage "$V_{ref*}$" value output to the first input 3120 of the comparator 312, the working voltage input of the second input 3122 of the comparator 312 will be eventually kept as the same value (e.g. "185 mv") as the predetermined reference voltage "$V_{ref*}$" during the feedback loop.

In contrast to the prior art, the system and method of the present invention is capable of reducing the impedance effect resulted from probing resistances by establishing multiple grounding paths to the test instrument. Thus, an accuracy of a signal measurement for the APC circuit can be highly raised.

The embodiments in accordance with the present invention can be implemented in a way of either solid circuit within a chip or the software, without departing from the spirit and scope of the present invention for any person skilled in the art.

What is claimed is:

1. A light-driving circuit, suited for measuring of a plurality of grounded probes of a test instrument and comprising:
    a light emission device for emitting a light in response to a control signal;
    a power detection device for detecting a power of the light to generate a working voltage signal;
    a comparator having a first input for receiving a reference voltage signal, a second input for receiving the working voltage signal, a ground node electrically connected to a ground pad, and an output depending upon a signal comparison between values of the working and reference voltage signals, generating a deciding signal; and
    a feedback circuit electrically connected to the output of the comparator, according to the deciding signal, providing the control signal to adjust the light power of the light emission device, wherein when the ground pad is located on a surface of a die and simultaneously connects the plurality of grounded probes, the connections among the ground pad and the grounded probes produce parallel probing resistances and establish multiple grounding paths.

2. The circuit of claim 1, wherein the light emission device is a laser pickup.

3. The circuit of claim 1, wherein the deciding signal of the comparator is output on a first level when the working and reference voltage signal values of the first and second inputs of the comparator are substantially different.

4. The circuit of claim 3, wherein the deciding signal output of the comparator is inverted from the first level to a second level when the working and reference voltage signal values of the first and second inputs of the comparator are substantially the same.

5. The circuit of claim 1, further comprising a digital to analog converter for converting a digital code into the reference voltage signal.

6. A light-driving circuit, suited for measuring of a plurality of grounded probes of a test instrument and comprising:
    a light emission device for emitting a light in response to a control signal;
    a power detection device for detecting a power of the light to generate a working voltage signal;
    a comparator having a first input for receiving a reference voltage signal, a second input for receiving the working voltage signal, a ground node electrically connected to a ground pad and a test pad, and an output depending upon a signal comparison between values of the working and reference voltage signals, generating a deciding signal, and
    a feedback circuit electrically connected to the output of comparator, according to the deciding signal, providing the control signal to the light emission device, wherein when either the ground pad or test pad is located on a surface of a die and simultaneously connects the plurality of grounded probes, the connections among either the ground pad or test pad and the grounded probes produce parallel probing resistances and establish multiple grounding paths.

7. The circuit of claim 6 wherein the light emission device is a laser pickup.

8. The circuit of claim 6 wherein the deciding signal of the comparator is output on a first level when the working and reference voltage signal values of the first and second inputs of the comparator are substantially different.

9. The circuit of claim 8, wherein the feedback circuit according to the first level of the deciding signal, provides the control signal to adjust the light power of the light emission device.

10. The circuit of claim 8 wherein the deciding signal of the comparator is inverted from the first level to a second level when the working and reference voltage signal values of the first and second inputs of the comparator are substantially the same.

11. The circuit of claim 10, wherein the feedback circuit according to the second level of the deciding signal, keeps the light power of the light emission device unchanged.

12. The circuit of claim 6, further comprising a digital to analog converter for converting a digital code to the reference voltage signal.

13. A circuit suited for measuring of a plurality of grounded probes of a test instrument and comprising:
   a reference source for generating a reference signal; and
   a comparator having a first input for receiving the reference signal, a second input for receiving a working signal, a ground node electrically connected to at least one ground pad located on a die, and an output depending upon a signal comparison between values of the working and reference signals;
   wherein when the at least one ground pad simultaneously connects the plurality of grounded probes, the connections among the at least one ground pad and the grounded probes produce parallel probing resistances and establish multiple grounding paths thereamong.

14. The circuit of claim 13, wherein the reference source is programmable for generating the reference signal.

15. The circuit of claim 14, wherein the reference source is a digital to analog converter for converting a digital code into the reference signal.

16. The circuit of claim 13, wherein the at least one ground pad includes a plurality of pads for respectively connecting the plurality of grounded probes to establish multiple grounding paths and thereby produce parallel probing resistances thereamong.

17. The circuit of claim 13, wherein the output of the comparator is on different level to involve the working signal, depending on when the working and reference signal of the first and second inputs of the comparator are substantially different or the same.

* * * * *